United States Patent
Lin et al.

(10) Patent No.: US 8,870,014 B2
(45) Date of Patent: Oct. 28, 2014

(54) MASK BOX HAVING A BUCKLING STRUCTURE

(75) Inventors: Chih-Ming Lin, New Taipei (TW); Kuan-Lun Pan, New Taipei (TW)

(73) Assignee: Gudeng Precision Industrial Co., Ltd., New Taipei (TW)

(*) Notice: Subject to any disclaimer, the term of this patent is extended or adjusted under 35 U.S.C. 154(b) by 229 days.

(21) Appl. No.: 13/492,418

(22) Filed: Jun. 8, 2012

(65) Prior Publication Data

US 2013/0248399 A1    Sep. 26, 2013

(30) Foreign Application Priority Data

Mar. 23, 2012    (TW) .............................. 101110221 A

(51) Int. Cl.
*B65D 45/16*    (2006.01)
*B65D 43/08*    (2006.01)

(52) U.S. Cl.
CPC ................ *B65D 45/16* (2013.01); *B65D 43/08* (2013.01)
USPC .......... 220/324; 220/4.25; 220/200; 220/315; 220/322; 220/326; 220/693; 220/783; 220/788; 206/454; 206/710; 206/711; 355/74

(58) Field of Classification Search
CPC ............................... B65D 46/16; B65D 43/08
USPC ........ 220/4.25, 200, 315, 322, 324, 326, 693; 206/454, 711; 355/74
See application file for complete search history.

(56) References Cited

U.S. PATENT DOCUMENTS 4,344,646 A * 8/1982 Michel ........................... 292/87
7,641,071 B2 * 1/2010 Wu ................................ 220/786

* cited by examiner

*Primary Examiner* — Elizabeth Volz
(74) *Attorney, Agent, or Firm* — Chun-Ming Shih; HDLS IPR Services

(57) ABSTRACT

A mask box having a buckling structure includes a base, a cover and a plurality of buckling elements. The base is configured to support a mask and has a plurality of troughs. The cover covers the base and has a plurality of pivotal portions. The buckling elements are positioned to correspond to the troughs. Each buckling element includes an engaging block and an elastic arm connected to the pivotal portion. The engaging block moves away from the periphery of the cover when the engaging block is subjected to an external force. The engaging block is buckled into the trough via an elastic restoring force of the at least one elastic arm when the external force is removed. By this arrangement, the assembly of the buckling elements is simplified and its product cost is reduced. Further, the present invention conforms to the requirements for environmental protection.

11 Claims, 6 Drawing Sheets

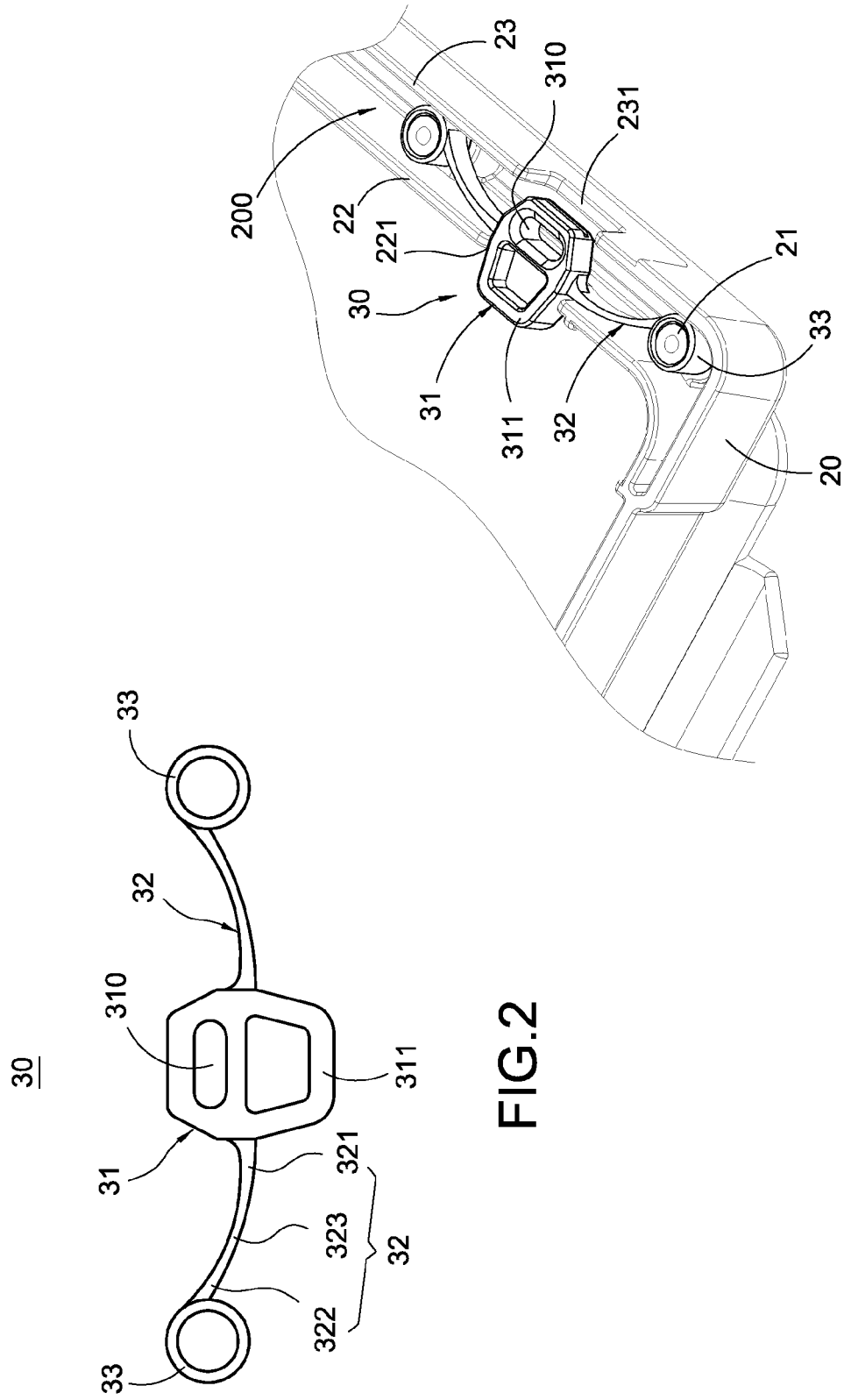

MASK BOX HAVING A BUCKLING STRUCTURE

BACKGROUND OF THE INVENTION

1. Field of the Invention

The present invention relates to a mask box, and in particular to a mask box having a buckling structure.

2. Description of Prior Art

Mask (also referred to as "reticle") is an element playing an important role on the yield of integrated circuits. Since many substances such as particles, moisture or molecules of chemical solutions exist in the operating environment during the production of integrated circuits, the light transmittance of the mask in the photolithography process will be deteriorated if the above-mentioned substances are adhered onto the surface of the mask. As a result, the yield of the elements of semiconductor or liquid crystal displays generated by the mask will be reduced. Thus, a mask box is usually used to preserve or transmit the mask, thereby preventing the substances such as dust, particles, moisture from being adhered onto the surface of the mask. Further, in order to prevent the mask disposed in the mask box from being contaminated by particles, dust, powder or hazard molecules, the factory for manufacturing integrated circuits requires the mask box to conform to the requirements of standard mechanical interface (SMIF), so that the particles and hazard gas substances can be prevented from entering the mask box, thereby increasing the degree of cleanness of the mask.

The conventional mask box comprises a shroud and a base covered by the shroud. The periphery of the shroud is provided with a plurality of locking modules for locking the base. In order to conform to the requirements for Standard Mechanical Interface (SMIF), when the mask box is disposed in an apparatus for manufacturing integrated circuits, robot arms of the apparatus are used to turn outwardly the locking modules provided on the periphery of the shroud to lock the base. However, the locking module comprises a supporting stand locked to the shroud, a locking arm pivotally provided on the supporting stand, and a restoring spring. Since the locking module has a plurality of components and the assembly of the locking module involves complicated steps, the manufacturing of the mask box takes more time and money. Further, the supporting stand and the locking arm of the locking module are made of plastic materials while the spring is made of metallic materials. Since the parts of the locking module are not made of the same material, it is not easy to recycle the parts of the locking module, which does not conform to the requirements for environmental protection.

In order to solve the above-mentioned problems, the present Inventor proposes a novel and reasonable structure based on his expert knowledge and deliberate researches.

SUMMARY OF THE INVENTION

The present invention provides a mask box having a buckling structure, wherein the assembly of the buckling structure is simplified and the production cost is reduced.

The present invention provides a mask box having a buckling structure, including a base, a cover and a plurality of buckling elements. The base is configured to support the mask. The bottom edge of the base is provided with a plurality of troughs. The cover covers the base. The inner edge of the cover has a plurality of pivotal portions. The buckling elements are positioned to correspond to the troughs. Each buckling element comprises an engaging block and at least one elastic arm extending from the engaging block. The other end of the at least one elastic arm is connected to the pivotal portion. The engaging block is subjected to an external force to move away from the periphery of the cover. After the external force is removed, the engaging block returns to buckle into the trough by means of the elastic restoring force of the at least one elastic arm.

The present invention provides a mask box having a buckling structure, wherein the buckling elements are made of plastic materials, so that the engaging block and the at least one elastic arm are integrally formed together. Since the parts of the buckling elements are made of the same material, the buckling elements can be recycled and thus conforms to the requirements for environmental protection.

The present invention provides a mask box having a buckling structure, wherein the at least one elastic arm is configured as a curved arm protruding toward the interior of the cover. The thickness of an inner section and an outer section of the at least one elastic arm is larger than that of a middle section, whereby the at least one elastic arm has a better strength and elastic restoring force.

In comparison with prior art, the buckling elements of the mask box of the present invention is not provided with a metallic spring. Thus, the buckling elements haveheir at least one elastic arms buckled into the trough via the elastic restoring force of the elastic arm, which reduces the number of the parts of the buckling elements. On the other hand, since the buckling elements of the present invention are directly combined with the pivotal portions of the cover, the time for locking the supporting stand and the spring in the conventional mask box can be eliminated, which reduces the production cost of the mask box. Therefore, the present invention really has practicability.

BRIEF DESCRIPTION OF DRAWING

FIG. 2 is a plan view showing the buckling element of the present invention;

FIG. 3 is a partially perspective view showing the cover and the buckling element of the mask box in accordance with the present invention after they are assembled;

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
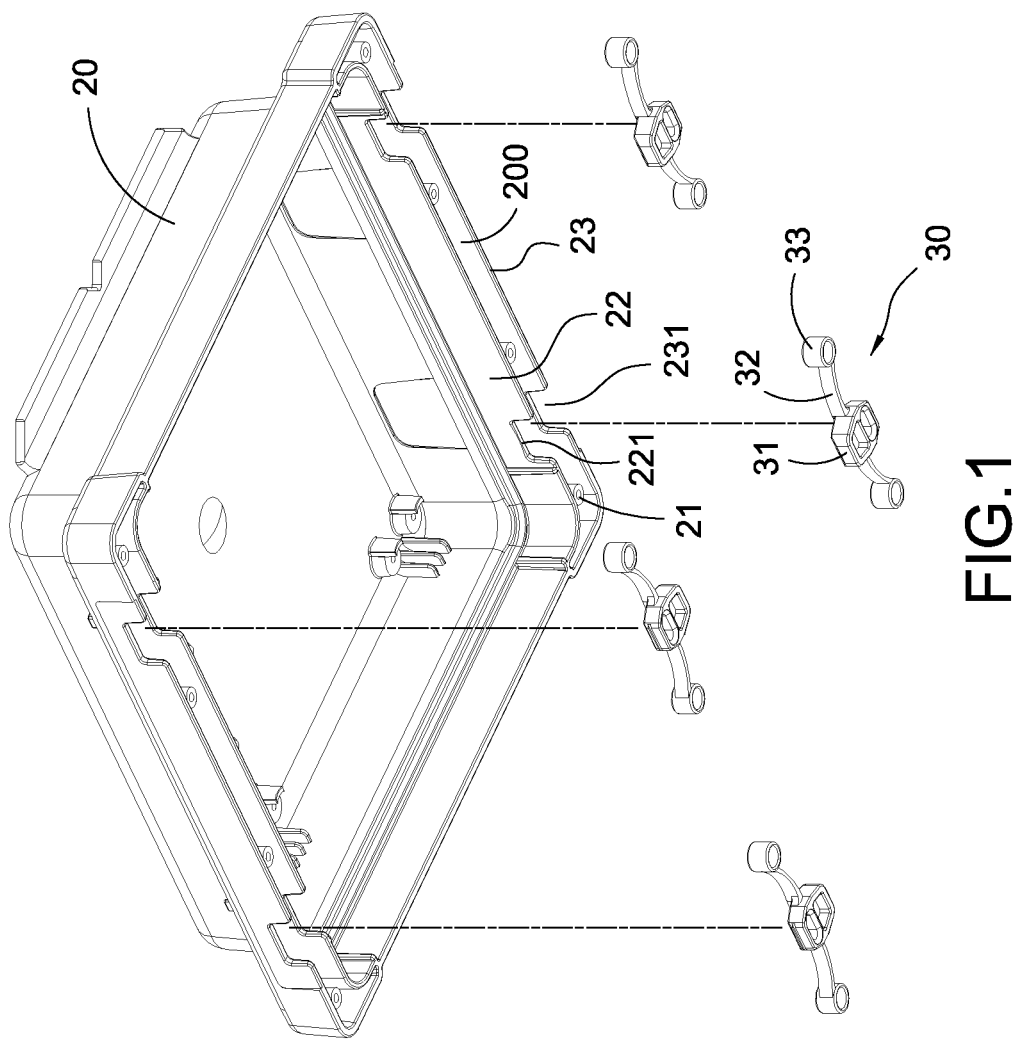
FIG. 1 is an exploded perspective view showing the cover and the buckling elements of the mask box in accordance with the present invention.
Figure 4:
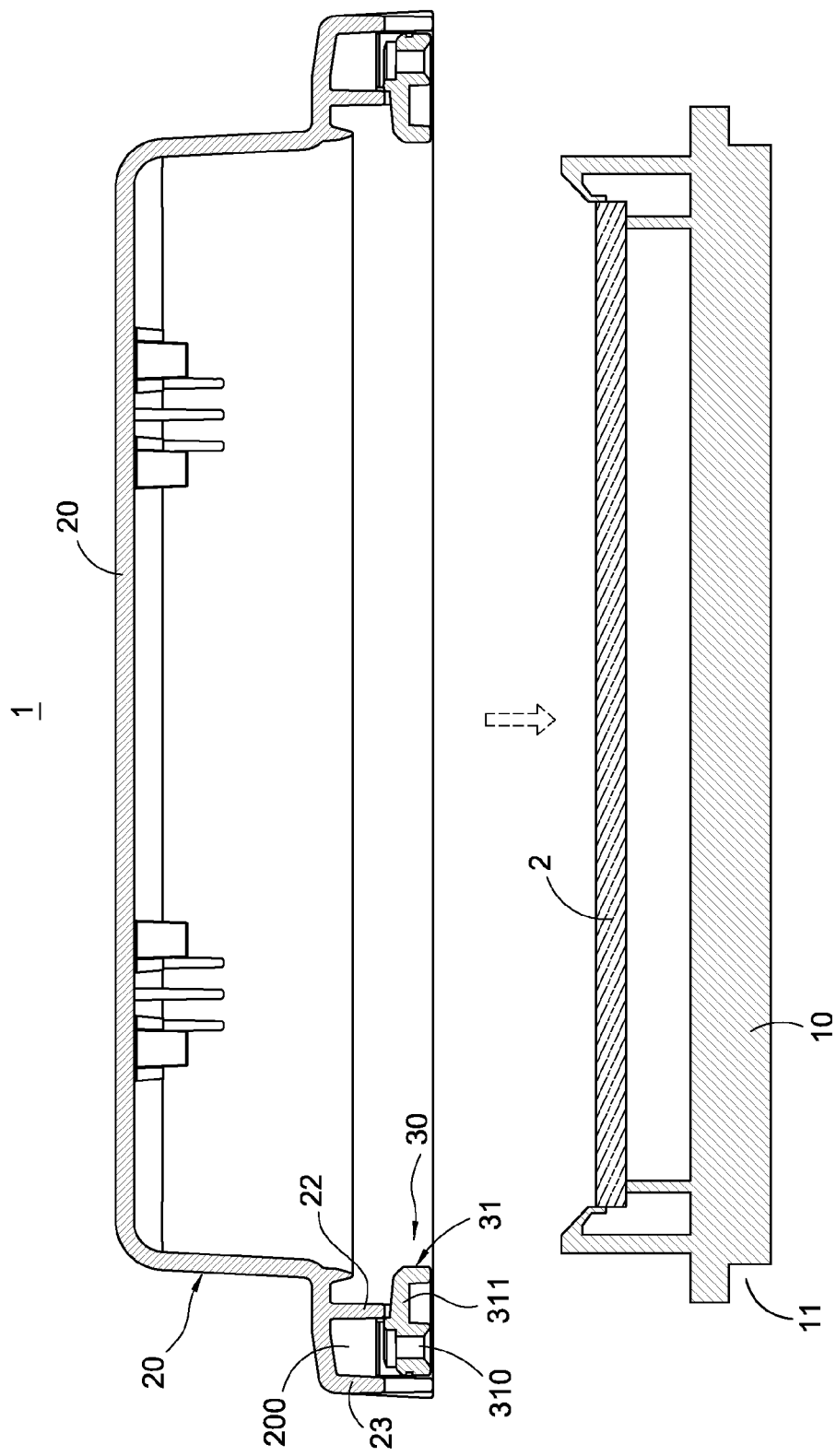
FIG. 4 is an assembled perspective view showing the cover and the base of the mask box in accordance with the present invention.

Please refer to FIGS. 1 to 4. FIG. 1 is an exploded perspective view showing the cover and the buckling elements of the mask box in accordance with the present invention. FIG. 2 is a plan view showing the buckling element of the present invention. FIG. 3 is a partially perspective view showing the cover and the buckling element of the mask box in accordance with the present invention after they are assembled. FIG. 4 is an assembled perspective view showing the cover and the base of the mask box in accordance with the present invention. The present invention provides a mask box 1 having a buckling structure to deposit the mask, which includes a base 10, a cover 20, and a plurality of buckling elements 30.

The base 10 is configured to support the mask 2. The bottom edge of the base 10 has a plurality of troughs 11.

The cover 20 covers the base 10. The inner periphery of the cover 20 has a plurality of pivotal portions 21. The buckling elements 30 are combined with the pivotal portions 21 and positioned to correspond to the troughs 11. In the present embodiment, the pivotal portion 21 is configured as a pivotal shaft, but it is not limited thereto.

Each of buckling elements 30 comprises an engaging block 31 and the at least one elastic arm 32 extending from the engaging block 31. The other end of the at least one elastic arm 32 is connected to the pivotal portion 21. In the present embodiment, one end of the at least one elastic arm 32 connected to the pivotal portion 21 is configured as a sleeve 33. Further, the buckling elements 30 are made of plastic materials. The engaging block 31 and the at least one elastic arm 32 can be integrally formed together.

As shown in FIG. 2, the structure of the buckling element 30 will be described in more detail. One end of the engaging block 31 is provided with a protrusion 311 for buckling into the trough 11. The other end of the engaging block 31 is provided with a through-hole 310 to which an external force is exerted. In the present embodiment, both sides of the engaging block 31 are provided with the at least one elastic arm 32 respectively. The at least two elastic arms 32 are symmetrically provided on the engaging block 31 and located in the same horizontal line.

It should be noted that, each elastic arm 32 comprises an inner section 321 connected to the engaging block 31, an outer section 322 connected to the pivotal portion 21 of the cover 20, and a middle section 323 provided between the inner section 321 and the outer section 322. The inner section 321, the outer section 322 and the middle section 323 are all formed into a curved shape, so that the whole elastic arm 32 is formed into a curved arm protruding toward the interior of the cover 20. Further, the thickness of the inner section 321 and the outer section 322 is larger than that of the middle section 323. For example, the thickness of the inner section 321 and the outer section 322 may be 2 mm, and the thickness of the middle section 323 may be 1 mm. By this arrangement, the at least one elastic arm 32 can have a better strength and elastic restoring force.

Please also refer to FIGS. 3 and 4. When the buckling element 30 is to be assembled, the sleeve 33 is put on the pivotal portion 21 (pivotal shaft). Then, a nut or other fastening element (not shown) is fastened to the pivotal shaft, thereby preventing the sleeve 33 from sliding off. When the engaging block 31 is moved due to an external force (such as a robot arm conforming to SMIF), the sleeve 33 can also rotate relatively to the pivotal portion 21 (pivotal shaft).

The cover 20 has an inner wall 22 adhered to the outer edge of the base 10 and an outer wall 23 located outside the inner wall 22 by an interval. An accommodating trough 200 is formed between the inner wall 22 and the outer wall 23. The pivotal portion 21 is located in the accommodating trough 200. Further, the inner wall 22 is provided with an inner notch 221 at a position corresponding to the engaging block 31. The outer wall 23 is provided with an outer notch 231 at a position corresponding to the engaging block 31. When the engaging block 31 is subjected to an external force, the engaging block 31 moves from the inner notch 221 toward the outer notch 231.

Figure 5:
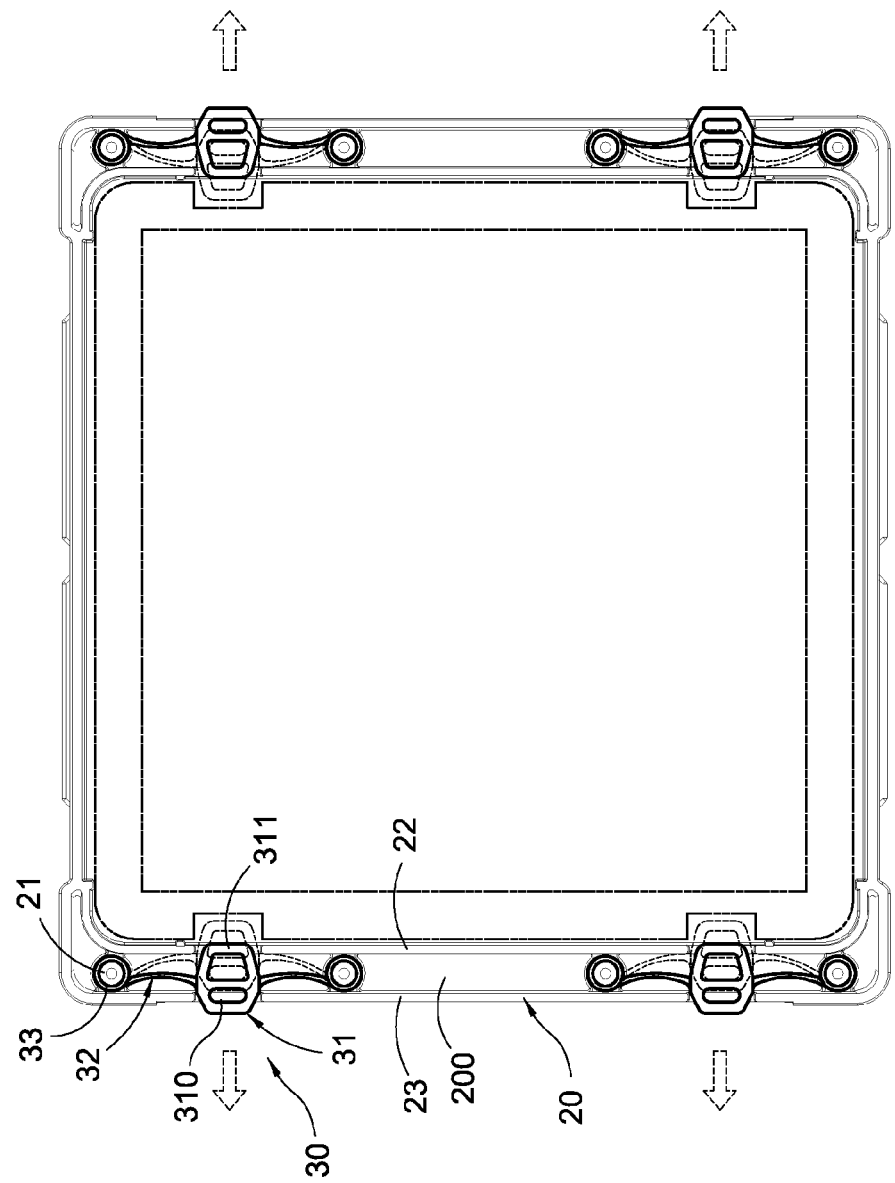
FIG. 5 is a plain view showing the operating state of the buckling elements of the mask box in accordance with the present invention.
Figure 7:
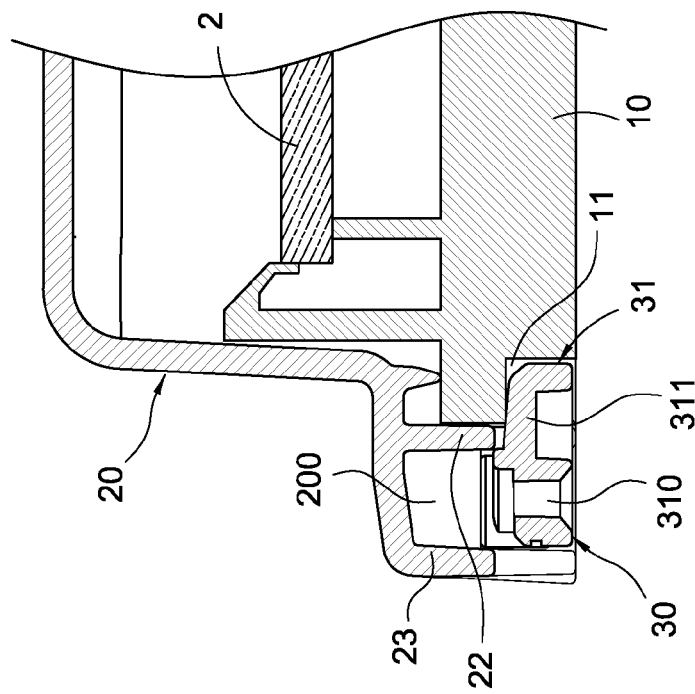
FIG. 7 is an assembled cross-sectional view showing the mask box of the present invention after one of the buckling elements buckle to the base.
Figure 6:
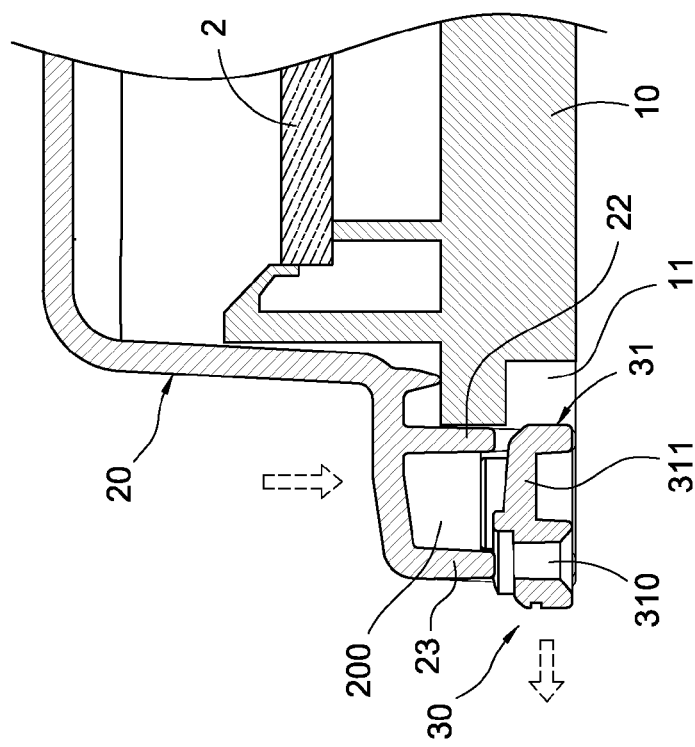
FIG. 6 is a schematic view showing the buckling operation of the mask box of the present invention.

Please refer to FIGS. 5 to 7. FIG. 5 is a plain view showing the operating state of the buckling elements 30 of the mask box 1 in accordance with the present invention. FIG. 6 is a schematic view showing the buckling operation of the mask box 1 of the present invention. FIG. 7 is an assembled cross-sectional view showing the mask box 1 of the present invention after one of the buckling elements 30 buckles to the base 10. After the buckling elements 30 are combined with the cover 20, the cover 20 can be buckled to the base 10 via the buckling elements 30.

In practice use, a device conforming to SMIF extends into the through-hole 310 of the engaging block 31, so that the device can exert a force on the buckling elements 30. Then, the engaging block 31 subjected to an external force moves away from the periphery of the cover 20. When the external force is removed, the protrusion 311 of the engaging block 31 is buckled into the trough 11 via the elastic restoring force of the at least one elastic arm 32.

Figure 9:
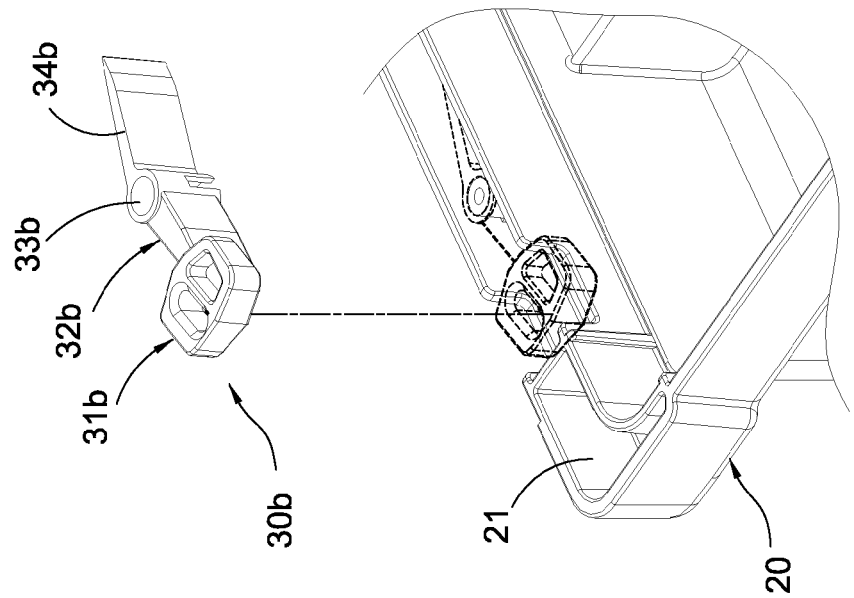
FIG. 9 is a schematic view showing the buckling element in accordance with a further embodiment of the present invention.
Figure 8:
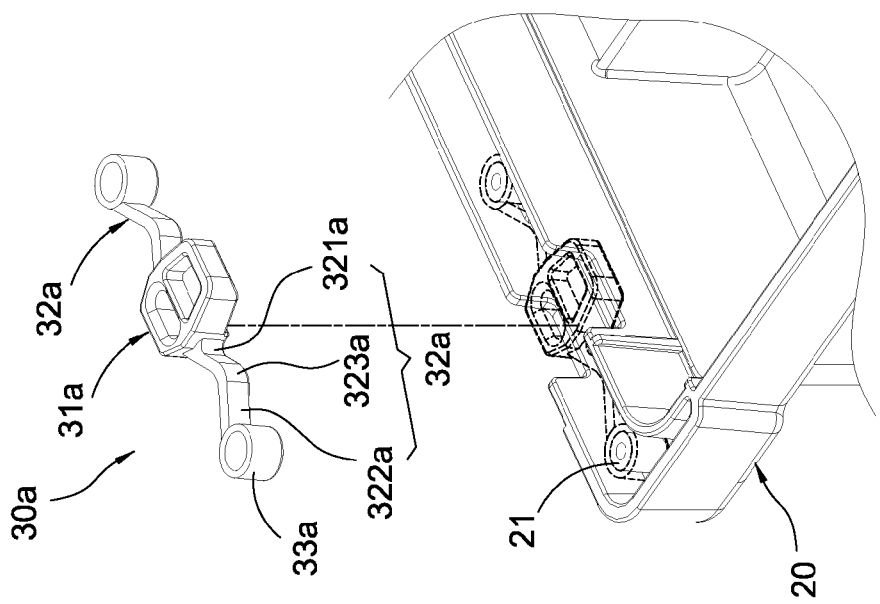
FIG. 8 is a schematic view showing the buckling element in accordance with another embodiment of the present invention.

Please refer to FIGS. 8 and 9, which show another two embodiments of the buckling elements 30a, and 30b of the present invention. In FIG. 8, the buckling element 30a comprises an engaging block 31a, two elastic arms 32a, and two sleeves 33a. The two sleeves 33a are put on the pivotal portion 21 of the cover 20. Each of the elastic arms 32a comprises an inner section 321a connected to the engaging block 31a, an outer section 322a connected to the pivotal portion 21 of the cover 20, and a middle section 323a provided between the inner section 321a and the outer section 322a.

The difference between the embodiment shown in FIG. 8 and the first embodiment lies in that: the inner section 321a and the outer section 322a are formed into a linear shape. The inner section 321a is obliquely provided from the engaging block 31a toward the interior of the cover 20. The outer section 322a is obliquely provided from the pivotal portion 21a toward the interior of the cover 20. The middle section 323a is bent to protrude toward the interior of the cover 20.

In FIG. 9, the buckling element 30b comprises an engaging block 31b, an elastic arm 32b and a sleeve 33b. The sleeve 33b is put on the pivotal portion 21 of the cover 20. The difference between the embodiment shown in FIG. 9 and the first embodiment lies in that: the buckling element 30b is only provided with an elastic arm 32b. The elastic arm 32b further comprises a stopping section 34b extending from the sleeve 33b. When the engaging block 31b is subjected to an external force to move toward the outside of the cover 20, the stopping section 34b moves in an opposite direction and is stopped by the cover 20b to generate an elastic restoring force.

Although the present invention has been described with reference to the foregoing preferred embodiments, it will be understood that present the invention is not limited to the details thereof. Various equivalent variations and modifications can still occur to those skilled in this art in view of the teachings of the present invention. Thus, all such variations and equivalent modifications are also embraced within the scope of the present invention as defined in the appended claims.

What is claimed is:

1. A mask box having a buckling structure, including:
   a base, configured to support a mask, a bottom edge of the base having a plurality of troughs;
   a cover, covering the base, an inner periphery of the cover having a plurality of pivotal portions; and
   a plurality of buckling elements, positioned to correspond to the troughs, each buckling element comprising an engaging block and at least one elastic arm extending from the engaging block, the other end of the at least one elastic arm being connected to one pivotal portion;
   wherein the engaging block moves away from the periphery of the cover when the engaging block is subjected to an external force, the engaging block is buckled into the trough via an elastic restoring force of the at least one elastic arm when the external force is removed, and
   wherein each pivotal portion is configured as a pivotal shaft, an end of the at least one elastic arm connected to the pivotal portion is configured as a sleeve, and the sleeve is put on the pivotal shaft and rotatable relative to the pivotal shaft.

2. The mask box having a buckling structure according to claim 1, wherein the at least one elastic arm is formed into a curved arm protruding toward the interior of the cover.

3. The mask box having a buckling structure according to claim 1, wherein the at least one elastic arm further comprises a stopping section extending from the sleeve, the stopping section moves in an opposite direction when the engaging block moves toward the outside of the cover by an external force, and then the stopping section is stopped by the cover to generate an elastic restoring force.

4. The mask box having a buckling structure according to claim 1, wherein one end of the engaging block is configured as a protrusion buckled into the trough, and the other end of the engaging block is provided with a through-hole to which an external force is exerted.

5. The mask box having a buckling structure according to claim 1, wherein the buckling elements are made of plastic materials, and the engaging block and the at least one elastic arm are integrally formed together.

6. The mask box having a buckling structure according to claim 1, wherein the cover has an inner wall adhered to an outer edge of the base and an outer wall provided outside the inner wall by an interval, an accommodating trough is formed between the inner wall and the outer wall, and the pivotal portion is located in the accommodating trough.

7. The mask box having a buckling structure according to claim 6, wherein the inner wall is provided with an inner notch at a position corresponding to the engaging block, the outer wall is provided with an outer notch at a position corresponding to the engaging block, and the engaging block is subjected to an external force to move from the inner notch toward the outer notch.

8. The mask box having a buckling structure according to claim 1, wherein the at least one elastic arm comprises an inner section connected to the engaging block, an outer section connected to the pivotal portion, and a middle section provided between the inner section and the outer section, and the thickness of the inner section and the outer section is larger than the thickness of the middle section.

9. The mask box having a buckling structure according to claim 8, wherein the inner section is obliquely provided from the engaging block toward the interior of the cover, the outer section is obliquely provided from the pivotal portion toward the interior of the cover, and the middle section is bent to protrude toward the interior of the cover.

10. The mask box having a buckling structure according to claim 1, wherein the both sides of the engaging block extend to form at least two elastic arms respectively, the at least two elastic arms are symmetrically provided and located in the same horizontal line.

11. The mask box having a buckling structure according to claim 10, wherein the elastic arm comprises an inner section connected to the engaging block, an outer section connected to the pivotal portion, and a middle section provided between the inner section and the outer section, and the thickness of the inner section and the outer section is larger than the thickness of the middle section.

* * * * *